United States Patent
Carrara et al.

(10) Patent No.: US 7,759,983 B2
(45) Date of Patent: Jul. 20, 2010

(54) DEVICE FOR COMPARING THE PEAK VALUE OF AT LEAST ONE VOLTAGE SIGNAL WITH A REFERENCE VOLTAGE

(75) Inventors: Francesco Carrara, Acireale (IT); Calogero Davide Presti, Caltanissetta (IT); Antonino Scuderi, Misterbianco (IT); Carmelo Santagati, Misterbianco (IT); Giuseppe Palmisano, San Giovanni La Punta (IT)

(73) Assignee: ST-Ericsson SA, Geneva (CH)

( * ) Notice: Subject to any disclaimer, the term of this patent is extended or adjusted under 35 U.S.C. 154(b) by 34 days.

(21) Appl. No.: 11/779,196

(22) Filed: Jul. 17, 2007

(65) Prior Publication Data

US 2008/0024175 A1  Jan. 31, 2008

(30) Foreign Application Priority Data

Jul. 25, 2006 (EP) ................................. 06425526

(51) Int. Cl.
*H03K 5/153* (2006.01)

(52) U.S. Cl. ......................................... 327/77; 327/50
(58) Field of Classification Search .................... 327/77
See application file for complete search history.

(56) References Cited

U.S. PATENT DOCUMENTS

| 4,605,867 | A |   | 8/1986 | Veehof |  |
| 5,471,169 | A |   | 11/1995 | Dendinger |  |
| 2005/0285634 | A1 | * | 12/2005 | Doyle et al. | .................. 327/72 |
| 2006/0028248 | A1 |   | 2/2006 | Gruber et al. |  |
| 2006/0061414 | A1 | * | 3/2006 | North | .......................... 327/551 |

OTHER PUBLICATIONS

European Search Report; EP 06 42 5526; Feb. 19, 2007.
Ericson, et al. "A Low-Power, CMOS Peak Detect and Hold Circuit for Nuclear Pulse Spectroscopy"; Nuclear Science Symposium and Medical Imaging Conference; IEEE 1994; pp. 44-48; vol. 1; IEEE Conference Record, Norfolk, VA.
Scuderi, et al. "A VSWR-Protected Silicon Bipolar RF Power Amplifier With Soft-Slope Power Control"; IEEE Journal of Solid-State Circuits; Mar. 2005; pp. 611-621; vol. 40, No. 3.

(Continued)

*Primary Examiner*—Lincoln Donovan
*Assistant Examiner*—Daniel Rojas
(74) *Attorney, Agent, or Firm*—William J. Kubida; Peter J. Meza; Hogan Lovells US LLP

(57) ABSTRACT

A device for comparing the peak value of a periodic voltage signal or a linear combination of periodic voltage signals with a reference voltage includes a reference transconductor element for converting the reference voltage into a reference current, respective transconductor elements for converting each of the periodic voltage signals into respective periodic current signals, a current-comparison node for comparing the respective periodic current signals with the reference current, generating a comparison current as a difference between the sum of the aforesaid periodic current signals and the reference current, a current rectifier supplied with the comparison current, a hold capacitor charged with the output current of the current rectifier, and a discharge-current generator in parallel to the hold capacitor. The voltage across the capacitor indicates of the outcome of the comparison between the peak value of the periodic voltage signal or the linear combination of periodic voltage signals and the reference voltage.

12 Claims, 9 Drawing Sheets

OTHER PUBLICATIONS

Cusinato "Gain/Bandwidth Programmable PA Control Loop for GSM/GPRS Quad-Band Cellular Handsets"; IEEE Journal of Solid-State Circuits; Jun. 2004; pp. 960-966; vol. 39, No. 6.

Arthanayake et al. "Linear Amplification Using Envelope Feedback"; Electronics Letters; Apr. 8, 1971; pp. 145-146; vol. 7, No. 7.

Reimann, et al. "A Single-Chip Bipolar AGC Amplifier with Large Dynamic Range for Optical-Fiber Receivers Operating up to 3 Gbits/s"; IEEE Journal of Solid-State Circuits; Dec. 1989; pp. 1744-1748; vol. 24, No. 6.

* cited by examiner

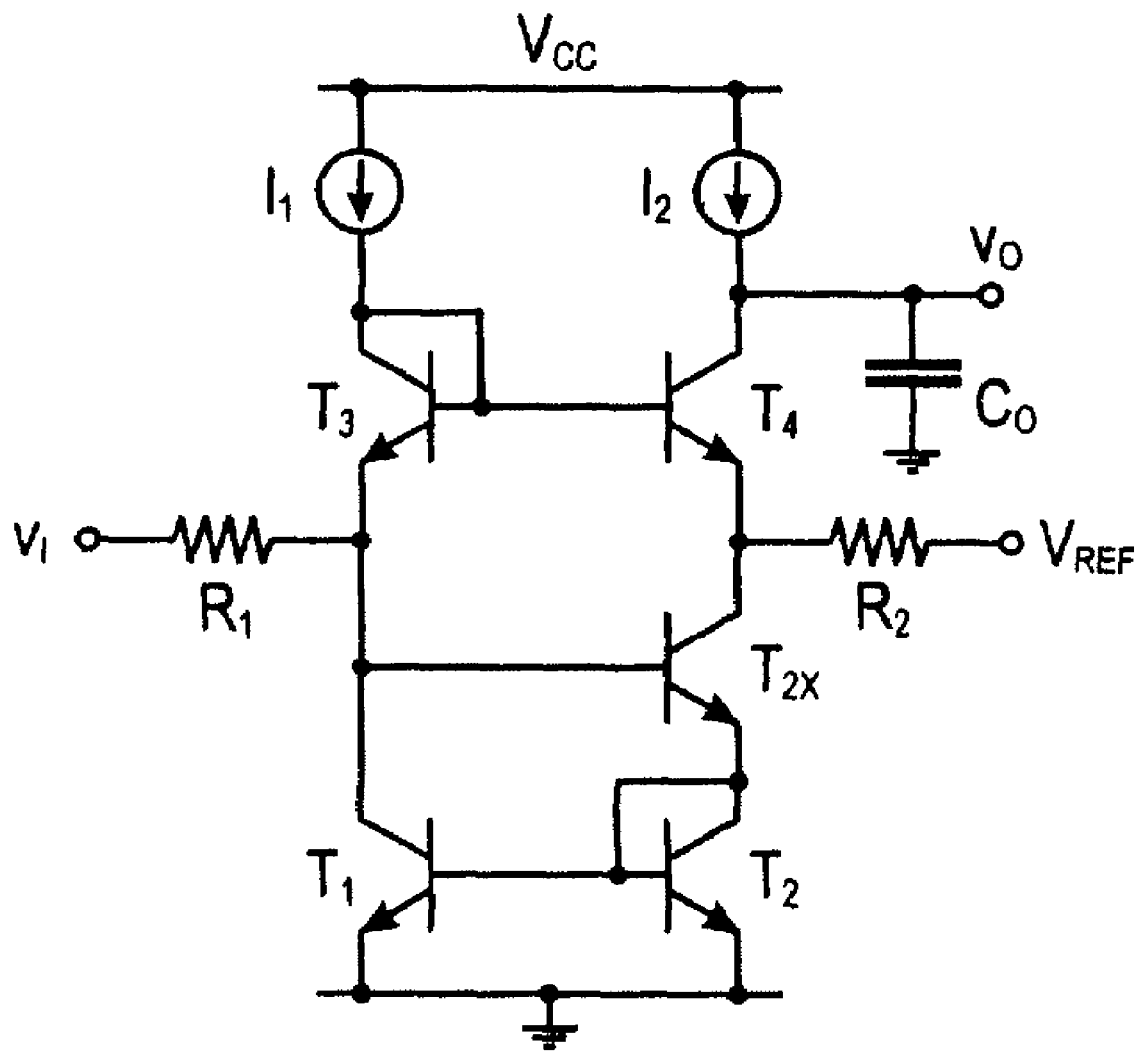
F I G . 6

DEVICE FOR COMPARING THE PEAK VALUE OF AT LEAST ONE VOLTAGE SIGNAL WITH A REFERENCE VOLTAGE

RELATED APPLICATION

The present application claims priority of European Patent Application No. 06425526.8 filed Jul. 25, 2006 and entitled A DEVICE FOR COMPARING THE PEAK VALUE OF AT LEAST ONE VOLTAGE SIGNAL WITH A REFERENCE VOLTAGE, which is incorporated herein in its entirety by this reference.

FIELD OF THE INVENTION

The present invention relates to techniques for comparing the peak value of at least one voltage signal with a reference voltage. The invention was developed with particular attention paid to its possible use in feedback systems for controlling the peak value of a periodic voltage or of a linear combination of periodic voltages.

BACKGROUND OF THE INVENTION

Numerous electronic circuits and systems, albeit finding application in very different technical fields, have in common the fact that their function is closed-loop control of the peak of a periodic voltage. Forming part of this category are, for example, certain apparatuses of widespread use in the field of radiofrequency applications; namely:

- feedback systems for protection of radiofrequency power amplifiers against "load mismatch"; see, for example: L. La Paglia, A. Scuderi, F. Carrara, and G. Palmisano, "A VSWR-protected silicon bipolar RF power amplifier with soft-slope power control", IEEE J. Solid-State Circuits, vol. 40, pp. 611-621, March, 2005;
- systems for closed-loop control of the output power in radiofrequency transmitters; see, for example: P. Cusinato, "Gain/bandwidth programmable PA control loop for GSM/GPRS quad-band cellular handsets", IEEE J. Solid-State Circuits, vol. 39, pp. 960-966, June, 2004;
- systems for the linearization of radiofrequency transmitters based upon the "envelope feedback" technique; see for example: T. Arthanayake and H. B. Wood, "Linear amplification using envelope feedback", IEE Electronics Letters, vol. 7, no. 7, pp. 145-146, 1971;
- systems for implementation of automatic gain control (AGC) in radiofrequency receivers; see, for example: R. Reimann and H. M. Rein, "A single-chip bipolar AGC amplifier with large dynamic range for optical-fiber receivers operating up to 3 Gbit/s", IEEE J. Solid-State Circuits, vol. 24, pp. 1744-1748, December, 1989.

The schematic circuit diagrams from which the aforesaid apparatuses draw inspiration can be represented in the simplified form appearing in FIG. 1.

In general, a variable-gain block 10 constitutes the direct path (variable-gain direct path) of the system. It receives at input a voltage signal in and supplies at output a voltage signal out, where in and out are periodic signals of time. The output out is monitored via a peak detector 20, and the peak detected is compared by an error amplifier 30 with an appropriately set reference voltage 35. The difference signal 40 (gain-control voltage) thus obtained drives the gain-control terminal 15 of the direct path. Thanks to the feedback, in the presence of a sufficiently high loop gain, the steady-state value of the output peak tends to equal the reference value, which is the ultimate target of the systems under examination.

The dashed part of the closed loop in FIG. 1, designated by the reference number 50, identifies the feedback path.

In the more general case where control is required of a linear combination of a number of periodic voltage signals instead of just one signal, the function implemented by the feedback path can be expressed in an analytical form as follows:

$$V_o = G\left[\max\left\{\sum_k A_k v_k(t)\right\} - V_{REF}\right] \quad (1)$$

where $V_O$ is the output voltage of the feedback path (designated by the reference number 40 in FIG. 1), $V_k(t)$ are the periodic voltages to be controlled, $A_k$ are the coefficients with which the inputs are linearly combined, $V_{REF}$ is the reference voltage, and G is the comparison gain. The sign of G is chosen in such a way as to ensure a negative feedback, and generally $|G|\gg 1$. The function $\max\{\cdot\}$ defines the maximum in time of the argument periodic function.

The solutions of the known art for implementation of the function described by Eq. 1 reflect the schematic circuit diagram illustrated in FIG. 2. The signal is processed entirely in voltage through a signal-conditioning block 60, which performs the combination of the inputs, a voltage peak detector 70, which extracts the peak of the combination, and a voltage comparator 80, which compares the peak with the reference voltage $V_{REF}$.

For the systems in question the requirement of bandwidth is usually essential. For example, in feedback systems for the protection of radiofrequency power amplifiers against load mismatch, maximizing the bandwidth means minimizing the times of response to the overvoltage stress on the final stage. However, such systems, for the very fact that they are feedback systems, require an appropriate compensation to ensure a congruous phase margin in the frequency response.

In general, it may be stated that obtaining a wide closed-loop bandwidth for a fixed phase margin is a task that is the more arduous, the greater the number of loop-gain poles. This is the reason why the solution illustrated in FIG. 2 is limited. It entails, in fact, the presence of at least two low-frequency poles: one is the pole through which the loop compensation is performed and is inherent in the voltage comparator (normally implemented as a normal operational amplifier); the other is the pole introduced by the hold capacitor on which the peak detector is based.

In the context of voltage-peak detectors, the most classic solutions of embodiment are those illustrated in FIGS. 3A, 3B and 3C.

In particular, FIGS. 3A and 3B show the open-loop solutions based upon the use, as rectifier element, respectively of a diode D1 (see for reference: J. Millman and A. Grabel, "*Microelettronica*", Milan, McGrawHill, 1994, pp. 59-61) and a transistor T1 (see for reference: R. G. Meyer, "Low-power monolithic RF peak detector analysis", IEEE J. Solid-State Circuits, vol. 30, pp. 65-67, January, 1995).

The advantage of the solution that uses the transistor as compared to the one that employs the diode lies in a more contained requirement in terms of current of the input signal thanks to the gain $\beta_F$ of the transistor $T_1$, to the advantage of the current consumption of the stage upstream. Both of the open-loop solutions, however, suffer from problems of accuracy caused by the fact that the p-n junction responsible for rectification presents a non-zero voltage drop between the input and the output. The error that follows therefrom can be corrected a posteriori, but the effectiveness of the correction is limited since said voltage difference depends upon the crest factor of the input waveform.

In order to improve the accuracy, it is possible to resort to feedback peak detectors, such as the one shown in FIG. 3C. In the presence of a high loop gain, the difference between the peak of the input voltage and the output voltage tends to zero. However, the solution is practicable only at relatively low frequencies, given the presence of an additional delay of propagation due to the gain stage.

SUMMARY OF THE INVENTION

From the foregoing description of the current situation, it may be appreciated that there exists the need to define solutions able to provide, in a more satisfactory way, the functions of peak detection and comparison combining accuracy and capacity of operating at high frequency.

The object of the present invention is to satisfy the aforesaid requirement.

According to the present invention, the above object is achieved by a device having the characteristics set forth in the annexed claims.

The claims are an integral part of the disclosure of the invention provided herein.

In the currently preferred embodiment, the solution described herein relates to a device for comparing the peak value of a periodic voltage signal or of a linear combination of periodic voltage signals with a reference voltage. The device is based upon the observation (demonstrated in what follows) whereby a current comparison followed by a current rectifier closed, with high impedance, on a capacitor is equivalent to a voltage peak detector followed by a voltage comparison.

In a currently preferred embodiment, the device includes a reference transconductor element for converting a reference voltage into a reference current, respective transconductor elements for converting each of the periodic voltage signals into respective periodic current signals, a current-comparison node for comparing the respective periodic current signals with the reference current, generating a comparison current as a difference between the sum of the periodic current signals and the reference current, a current rectifier supplied with the comparison current, a hold capacitor charged with the output current of the current rectifier, the voltage across the capacitor indicating the outcome of the comparison between the peak value of the periodic voltage signal or the linear combination of periodic voltage signals and the reference voltage, and a discharge-current generator in parallel with the hold capacitor.

BRIEF DESCRIPTION OF THE DRAWINGS

The invention will now be described, by way of non-limiting example, with reference to the figures of the annexed drawings, in which:

FIGS. 6, 7, 8 and 9 show some possible variants of the circuit embodiment of FIG. 5.

DETAILED DESCRIPTION OF EXEMPLARY EMBODIMENTS

Figure 4:
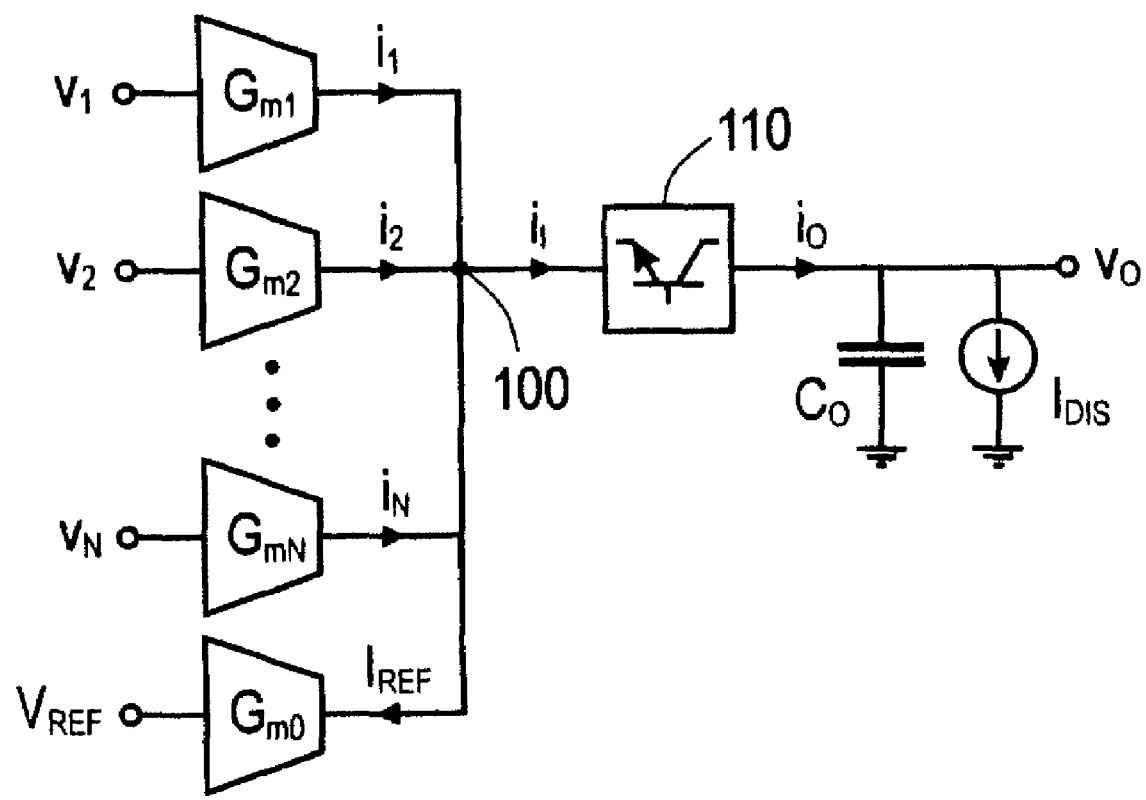
FIG. 4 is a block diagram representing the functions of peak detection and comparison according to the invention.

FIG. 4 is a schematic illustration of a block diagram of the functions of peak detection and comparison according to the invention for implementing Eq. 1 given above.

In the solution described herein, the signal processing occurs in current rather than in voltage.

For this purpose, the periodic voltage signals $v_1(t)$, $v_2(t)$, ..., $v_N(t)$ to be processed and the reference voltage $V_{REF}$ are converted into as many respective currents $i_1(t)$, $i_2(t)$, ..., $i_N(t)$ via appropriate transconductor elements $G_{m1}$, $G_{m2}$, ..., $G_{mN}$. Likewise, the reference voltage $V_{REF}$ is converted into a corresponding reference current $I_{REF}$ via a further transconductor element $G_{m0}$. Thus we have:

$$i_1(t) = G_{m1} v_1(t) \quad (2)$$

$$i_2(t) = G_{m2} v_2(t)$$

$$...$$

$$i_N(t) = G_{mN} v_N(t)$$

$$I_{REF} = G_{m0} V_{REF}$$

All the currents in question converge towards a single current-comparison node 100 where the comparison effectively takes place.

The current $I_{REF}$ is generated in such a way that its contribution to the node present with negative sign, and hence, on the direct branch downstream, a comparison current $i_I(t)$ is obtained, given by:

$$i_I(t) = \sum_{k=1}^{N} i_k(t) - I_{REF} \quad (3)$$

i.e., $$i_I(t) = G_{m0}\left(\sum_{k=1}^{N} \frac{G_{mk}}{G_{m0}} v_k(t) - V_{REF}\right) \quad (4)$$

Said comparison current is sent to a current rectifier 110, the function of which is to reproduce at output only the positive portion of the input current waveform.

Consequently, the output current $i_O(t)$ at output from the current rectifier can be expressed symbolically as $$i_O(t) = \mathrm{pos}\{i_I(t)\} \quad (5)$$

where the function $\mathrm{pos}\{\cdot\}$ is defined as follows:

$$pos\{x\} = \begin{cases} x & per\ x \geq 0 \\ 0 & per\ x < 0 \end{cases} \quad (6)$$

As long as the input current $i_I(t)$ is maintained always negative, the output current $i_O(t)$ is zero and the output voltage $v_O(t)$ on the hold capacitor $C_O$ remains low as a result of the discharge-current generator $I_{DIS}$.

Instead, if the input current presents positive during part of the period or for the entire duration thereof, also the output current is accordingly positive and tends to charge the capacitor $C_O$, increasing the output voltage $v_O(t)$.

Assuming that the capacitor $C_O$ is of a value that is sufficiently high as to enable the ripple of the output voltage to be neglected, just the d.c. component $V_O$ of the voltage $v_O(t)$ can be considered.

Said d.c. component $V_O$ can be calculated by performing the balancing of the currents at the output node and evaluating the average thereof over a period. By so doing, the following expression is obtained:

$$V_O = R_O \overline{(i_O(t) - I_{DIS})} \qquad (7)$$
$$= R_O \overline{pos\{i_I(t)\}} - R_O I_{DIS}$$

where $R_O$ is the total impedance at the output node (resulting from the parallel between the output impedance of the current rectifier and the impedance that in the real circuit is inevitably associated to the generator $I_{DIS}$), and the sign $^-$ designates the time average of the argument periodic function.

When approximating Eq. 7, the quantity $\overline{pos\{i_I(t)\}}$ is proportional to $\max\{i_I(t)\}$ for values of $\max\{i_I(t)\}$ positive and small. Hence, if $\Delta$ indicates the constant of proportionality, from Eq. 7 we can derive:

$$V_O = \Delta R_O \max\{i_I(t)\} - R_O I_{DIS} \qquad (8)$$
$$= \Delta R_O \max\left\{G_{m0}\left[\sum_{k=1}^{N} \frac{G_{mk}}{G_{m0}} v_k(t) - V_{REF}\right]\right\} - R_O I_{DIS}$$
$$= \Delta G_{m0} R_O \left[\max\left\{\sum_{k=1}^{N} \frac{G_{mk}}{G_{m0}} v_k(t)\right\} - V_{REF}\right] - R_O I_{DIS}$$

Furthermore, assuming that the discharge current $I_{DIS}$ will determine in steady-state conditions a negligible contribution on $V_O$, Eq. 8 can be approximated as follows:

$$V_O = \Delta G_{m0} R_O \left[\max\left\{\sum_{k=1}^{N} \frac{G_{mk}}{G_{m0}} v_k(t)\right\} - V_{REF}\right] \qquad (9)$$

which is formally equivalent to Eq. 1 that was to be implemented.

Eq. 9 confirms that a current comparison followed by a current rectifier closed, with high impedance, on a capacitor is equivalent to a voltage peak detector followed by a voltage comparison. In particular, it is to be noted that the diagram proposed in FIG. 4 reverses the order with which the operations of peak detection and comparison are carried out as compared to the solution of FIG. 2 corresponding to the known art.

From Eq. 9 it may incidentally be noted that the need for a high comparison gain results, in a circuit embodiment, in the need for a high impedance at the output node in FIG. 4.

As regards the discharge-current generator $I_{DIS}$, it is to be noted that, in spite of the error term $R_O I_{DIS}$ caused thereby in Eq. 8, its presence proves indispensable to prevent the discharge times of $C_O$ from becoming too long with respect to the requirements of the application in question.

Figure 5:
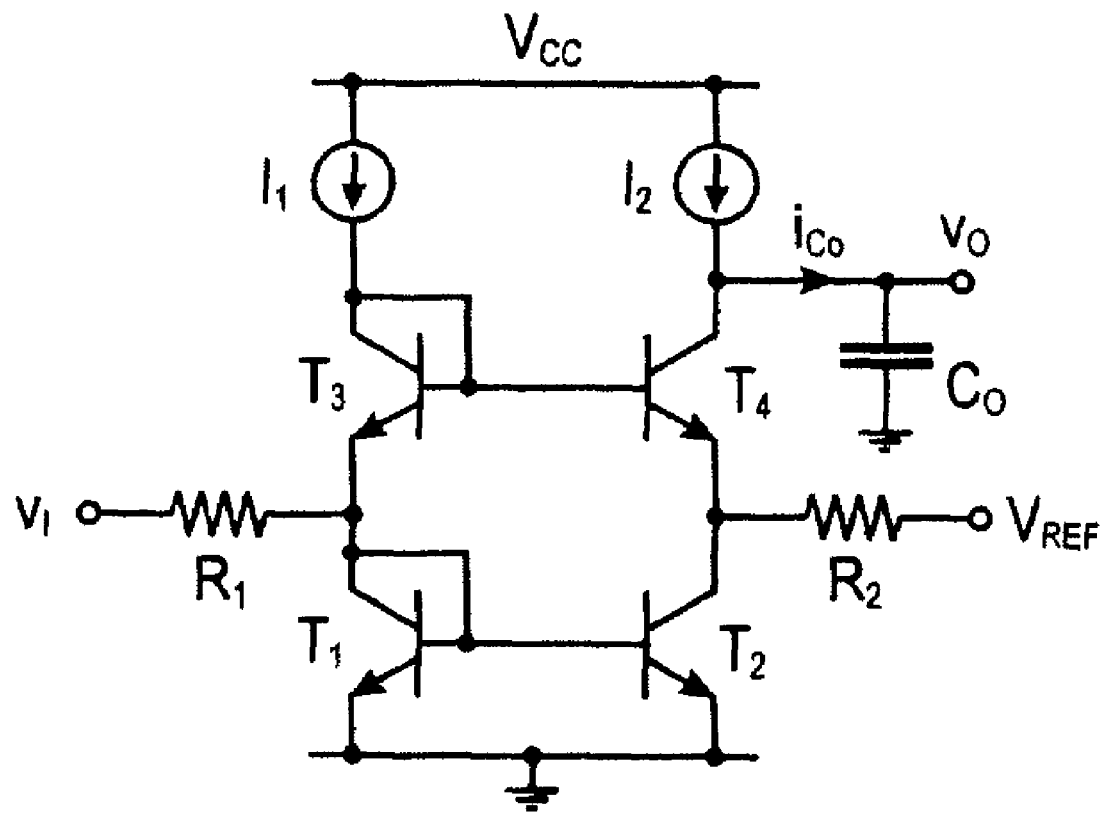
FIG. 5 shows a circuit embodiment of the system FIG. 4.

A possible circuit embodiment of FIG. 4 is shown in FIG. 5. In this embodiment, the current-comparison node 100 and the current rectifier 110 of FIG. 4 are obtained via a differential-amplifier stage to the inputs of which the voltage signal and the reference voltage are fed back, via the resistances $R_1$ and $R_2$, respectively. The reference voltage $V_{REF}$ is supplied to the inverting input of the differential stage.

In the detail, the amplifier stage comprises four bipolar transistors (BJTs) $T_1$, $T_2$, $T_3$, and $T_4$.

Of these, the transistors $T_1$ and $T_3$, both with their base (i.e., their control terminal, represented by the gate in the case of a FET implementation) short-circuited on their collector (i.e., their current-inflow terminal or current-collection terminal, represented by the drain in the case of a FET implementation), are cascaded (i.e., set in series) between the supply voltage $V_{CC}$ and ground so as to have their respective collector-emitter paths traversed by one and the same current $I_1$. The voltage $V_I$ undergoing comparison is supplied via a resistor $R_1$ at the point of connection between the collector of the "bottom" transistor $T_1$ and the emitter of the "top" transistor $T_3$.

The transistors $T_2$ and $T_4$, the bases of which are not short-circuited on the collectors, are also cascaded (i.e., set in series) between the supply voltage $V_{CC}$ and ground so as to have their respective collector-emitter paths traversed by one and the same current $I_2$. The reference voltage $V_{REF}$ is supplied via a resistor $R_2$ at the point of connection between the collector of the "bottom" transistor $T_2$ and the emitter of the "top" transistor $T_4$, coming under which is the hold capacitor $C_0$, across which the output voltage $V_0$ is taken. The hold capacitor $C_0$ is thus driven via the second pair of transistors $T_2$, $T_4$.

The embodiment of FIG. 5 relates to the simple case in which only one input voltage $v_I(t)$, in addition to the reference voltage $V_{REF}$, is processed.

Operation of said circuit can be explained by analogy with the schematic circuit diagram described previously: the capacitor $C_O$ and the current generator $I_2$ in FIG. 5 play a role similar to that of $C_O$ and $I_{DIS}$, respectively, in FIG. 4.

The current rectifier 110 of FIG. 4 is implemented, in the circuit form, via the transistor $T_4$ in FIG. 5, exploiting the fact that its collector current can flow only in the descending direction.

The current-comparison node 100 in FIG. 4 corresponds to the emitter node of the transistor $T_4$ in FIG. 5.

Finally, the voltage-to-current conversion provided by the scheme in FIG. 4 is obtained via the two resistors $R_1$, $R_2$ and the mirror formed by the transistors $T_1$-$T_2$ in FIG. 5. In particular, the mirror $T_1$-$T_2$ causes the current contribution deriving from $v_I(t)$ to reach the current-comparison node 100 with opposite sign with respect to the current contribution deriving from $V_{REF}$.

For an understanding of the function of the transistor $T_3$ and of the generator $I_1$ in FIG. 5, the following is to be considered: when $T_4$ is on, the balancing of the currents at the output node (neglecting for simplicity the base currents) yields $$i_{Co}(t) = \frac{V_{REF} - v_{C2}(t)}{R_2} + I_2 - \frac{A_{E2}}{A_{E1}}\left(\frac{v_I(t) - v_{C1}(t)}{R_1} + I_1\right) \qquad (10)$$

where $i_{Co}(t)$ is the current that flows through the capacitor $C_O$, whilst $v_{C1}(t)$ and $v_{C2}(t)$ are the voltages at the collectors of the transistors $T_1$ and $T_2$, respectively. If the following condition is satisfied:

$$\frac{A_{E2}}{A_{E1}} = \frac{R_1}{R_2} = \frac{I_2}{I_1} \quad (11)$$

where $A_{E1}$ and $A_{E2}$ are the emitter areas of the transistors $T_1$ and $T_2$, then $$i_{C_O}(t) = -\frac{v_I(t) - V_{REF} + v_{C2}(t) - v_{C1}(t)}{R_2} \quad (12)$$

Thanks to the presence of the transistor $T_3$, the voltages $v_{C1}(t)$ and $v_{C2}(t)$ are approximately the same as one another and cancel out (since $v_{C1}-v_{C2}=v_{BE4}-v_{BE3}$ and $v_{BB4} \cong v_{BE3}$), to obtain $$i_{C_O}(t) = -\frac{v_I(t) - V_{REF}}{R_2} \quad (13)$$

Hence, it may be stated that the use of the transistor $T_3$ (and of the generator $I_1$ necessary for biasing it) is functional for eliminating the offset terms that arise in the voltage-to-current conversion performed by the resistances $R_1$ and $R_2$.

We note incidentally that, on account of the natural direction of the current rectifier $T_4$ and of the generator $I_2$, the response of the circuit in FIG. 5 has a sign opposite to that of the scheme in FIG. 4; i.e., $v_O(t)$ remains at a high value as long as $v_I(t)$ is always lower than $V_{REF}$ and drops to a low value when the peak of $v_I(t)$ exceeds $V_{REF}$. This is confirmed by the negative sign in the second member of Eq. 13.

FIG. 6 shows an improved version of the circuit of FIG. 5. It may be noted that the simple mirror $T_1$-$T_2$ in FIG. 5 has been replaced with a Wilson mirror comprising the transistors $T_1$, $T_2$ and $T_{2X}$. This modification improves the accuracy in the transfer of the signal from the input $v_I(t)$ to the current-comparison node 100 since it reduces the systematic error associated to the current gain of the mirror. It will be appreciated moreover that, whereas in the embodiment of FIG. 5 (and of FIG. 7, which will be described hereinafter), the transistors of the first pair $T_1$, $T_3$ both have their control terminal (base) short-circuited with the current-inflow terminal (collector), in the embodiment of FIG. 6, said short-circuit arrangement between the control terminal and the current-inflow terminal is adopted for the "top" transistor $T_3$ of the first pair $T_1$, $T_3$, referenced to the supply voltage $V_{CC}$, and the "bottom" transistor $T_2$ of the second pair $T_2$, $T_4$, referenced to ground, associated to which is the further transistor $T_{2X}$ of the Wilson mirror.

In an implementation with MOSFETs, a similar improvement can be obtained by replacing the simple mirror $T_1$-$T_2$ in FIG. 5 with a cascode mirror.

Figure 7:
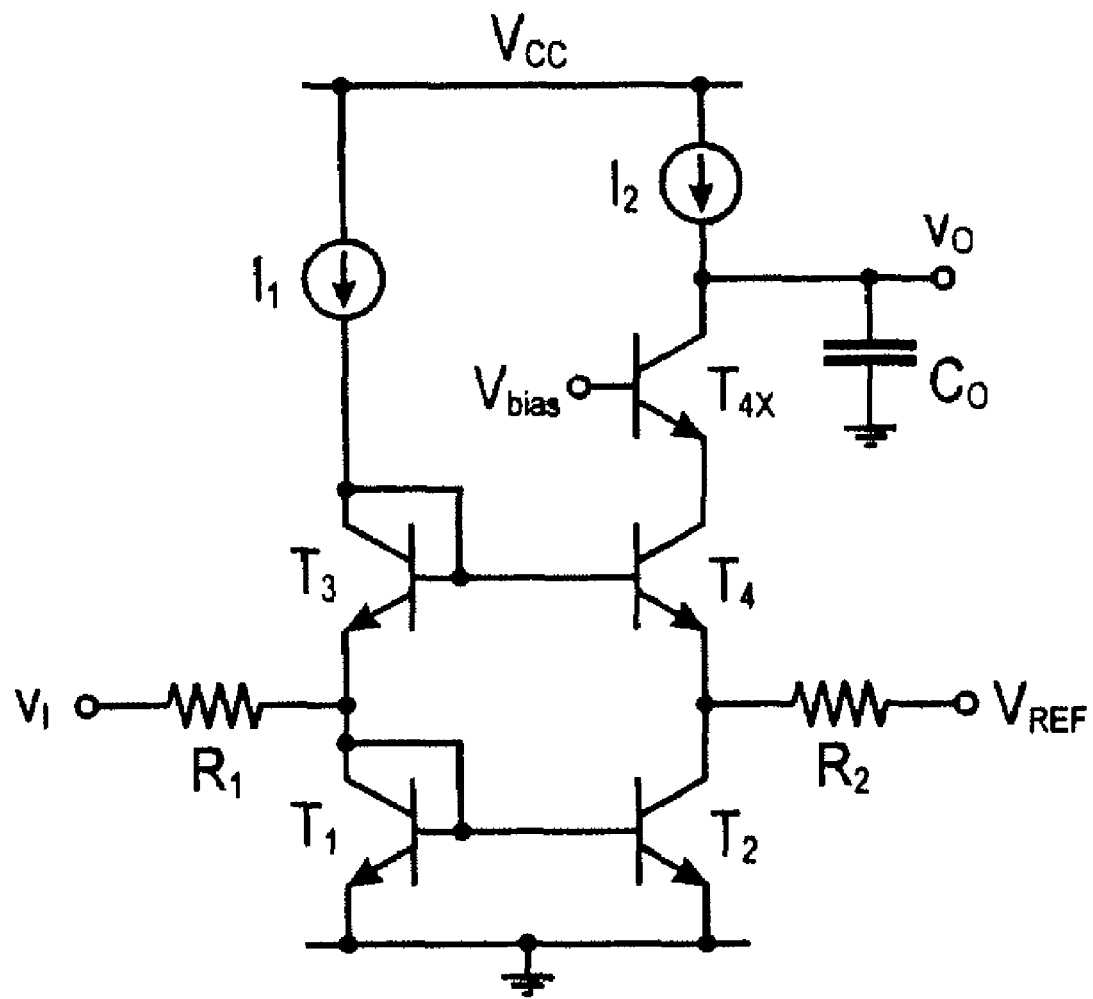

FIG. 7 shows another improved version of the circuit of FIG. 5. In this case, the output has been cascoded by adding a further transistor $T_{4X}$ in common-base configuration downstream of the current rectifier $T_4$.

This modification achieves the effect of increasing significantly the output impedance of the rectifier and therewith the comparison gain of the circuit (see Eq. 9).

It should be noted that the improvements that can be obtained via the versions illustrated in FIGS. 6 and 7 present a cost. In both cases, in fact, the capacity of the circuit to work with low supply voltages is reduced.

Figure 8:
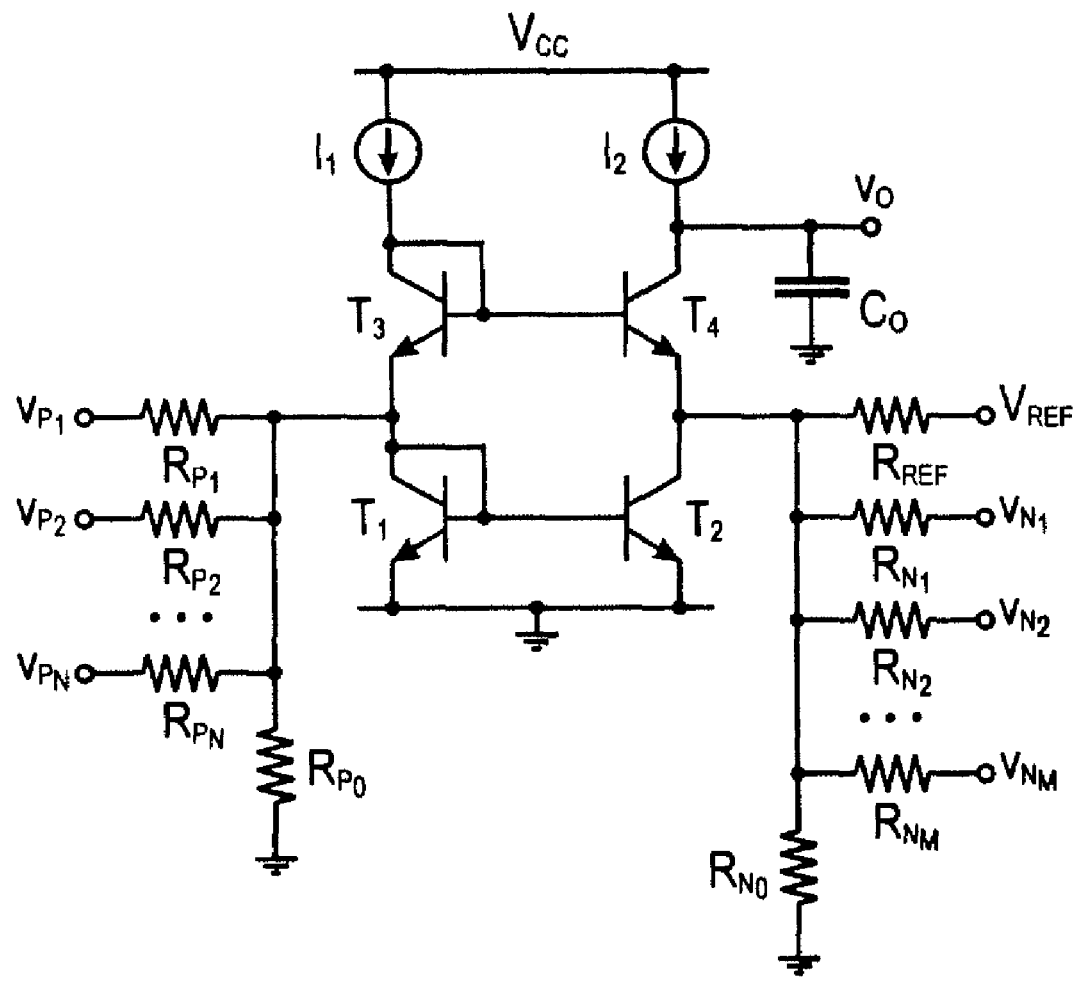

FIG. 8 shows a more general version of the circuit able to process multiple input periodic voltage signals by performing a linear combination thereof. The inputs $v_{P_1}(t)$, $v_{P_2}(t)$ ... $v_{P_N}(t)$ contribute with a positive sign to the linear combination, whilst the inputs $v_{N_1}(t), V_{N_2}(t), \ldots, v_{N_M}(t)$ contribute with a negative sign.

In fact, the function implemented by the circuit in FIG. 8 can be symbolically expressed as follows:

$$V_O = \Delta \frac{R_O}{R_{REF}} \left[ \max \left\{ \sum_{k=1}^{N} \frac{R_{REF}}{R_{P_k}} v_{P_k}(t) - \sum_{k=1}^{M} \frac{R_{REF}}{R_{N_k}} v_{N_k}(t) \right\} - V_{REF} \right] \quad (14)$$

which is true, provided that the following rule is respected:

$$\frac{R_{P_0} // R_{P_1} // R_{P_2} // \ldots // R_{P_N}}{R_{REF} // R_{N_0} // R_{N_1} // R_{N_2} // \ldots // R_{N_M}} = \frac{A_{E2}}{A_{E1}} \quad (15)$$

The reason why the condition of Eq. 15 must be satisfied can be reduced to what has already been noted with reference Eq. 12 as regards the possibility that the offset terms ($v_{C1}(t)$ and $v_{C2}(t)$) cancel out. In fact, if we write the balancing of the currents at the current-comparison node 100, we realize that said simplification occurs only if Eq. 15 is satisfied.

Figure 9:
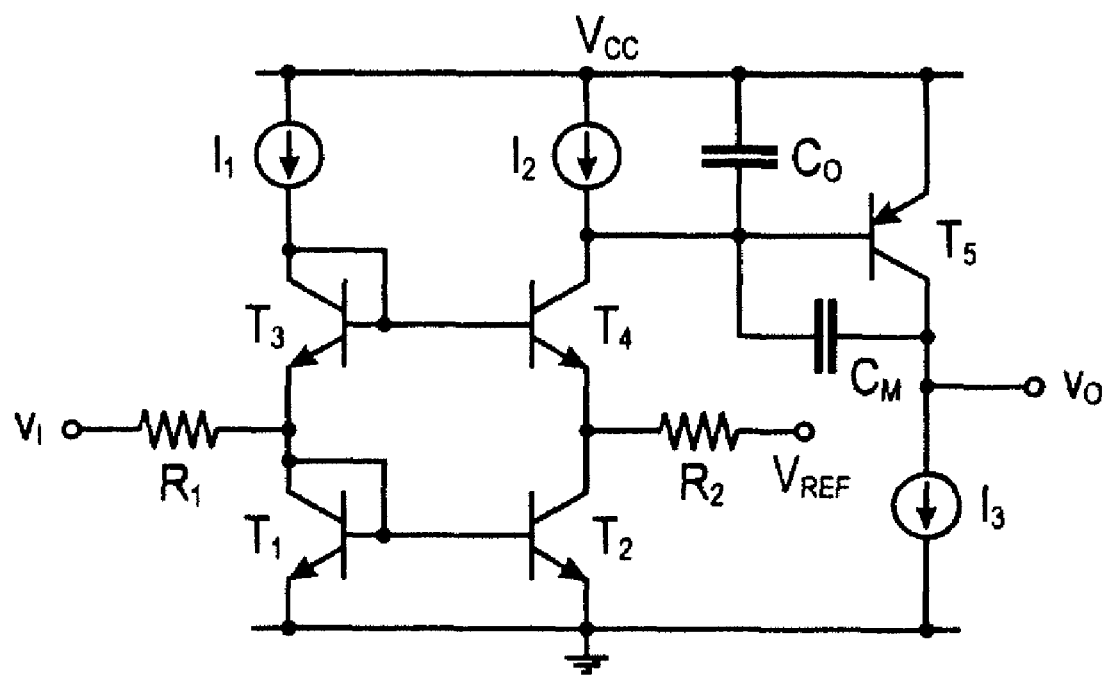

FIG. 9 shows a last circuit variant characterized by the addition of the pnp common-emitter stage $T_5$ downstream of the circuit previously described. The advantage obtained with this modification (in addition to the obvious increase in the gain) lies in the fact that it enables compensation of the loop of which the circuit in FIG. 9 forms part, without introducing any further low-frequency poles.

In fact, via the capacitor $C_M$, it is possible to carry out a compensation by the Miller effect. As is known, the pole splitting associated to said compensation displaces the high-frequency pole at the output node, and hence the single low-frequency node that survives is the one at the collector of $T_4$. As has already been noted, limiting the number of low-frequency poles of the loop gain proves advantageous in terms of closed-loop bandwidth and/or phase margin.

All the circuit schemes described can function also by replacing the current generators $I_1$ and $I_2$ with as many resistors, thus obtaining even simpler topologies, even though characterized by a smaller comparison gain.

With reference to what has been described up to now, we can state that the method and the circuits proposed present various advantages as compared to the known art.

Figure 1:
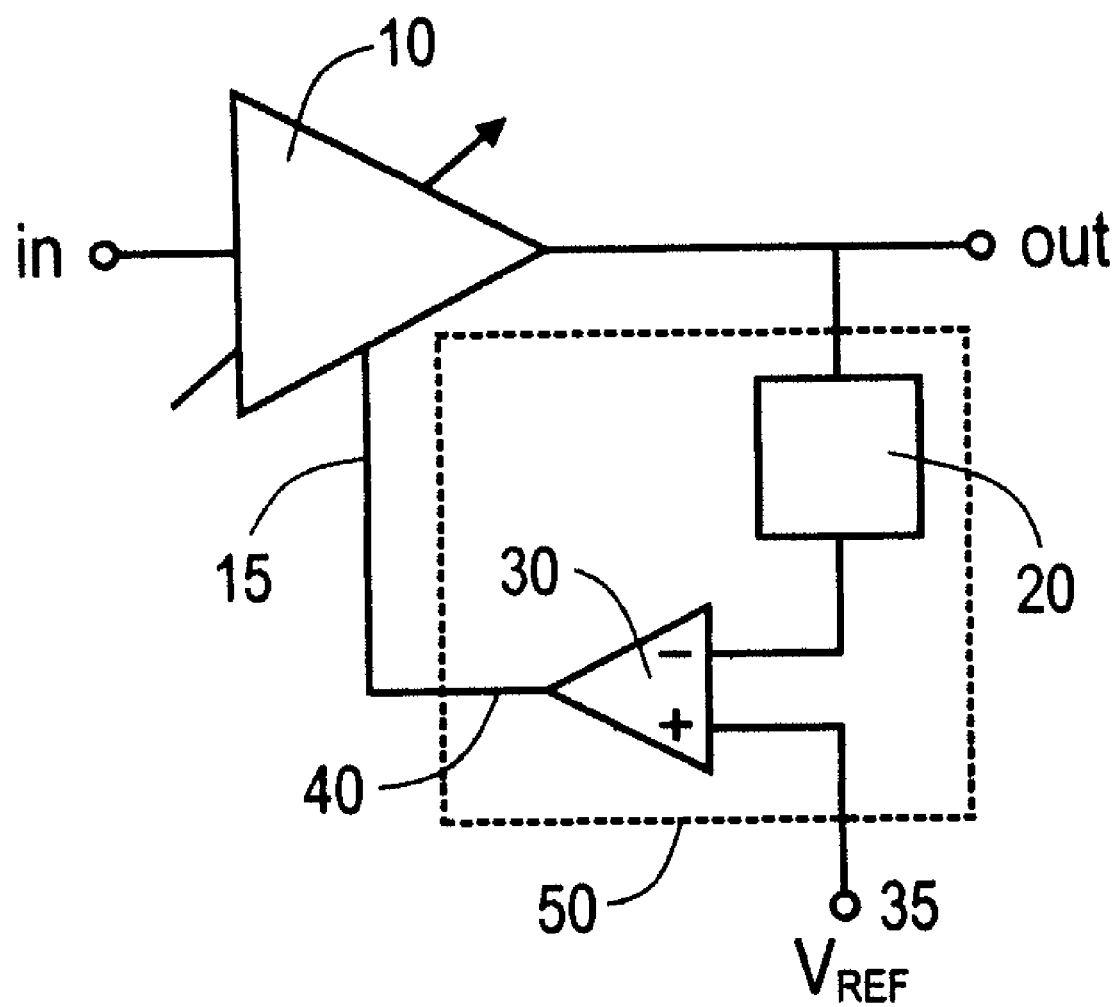
FIG. 1, FIG. 2, and FIGS. 3A, 3B and 3C, corresponding to the known art, have already been described previously.
Figure 2:
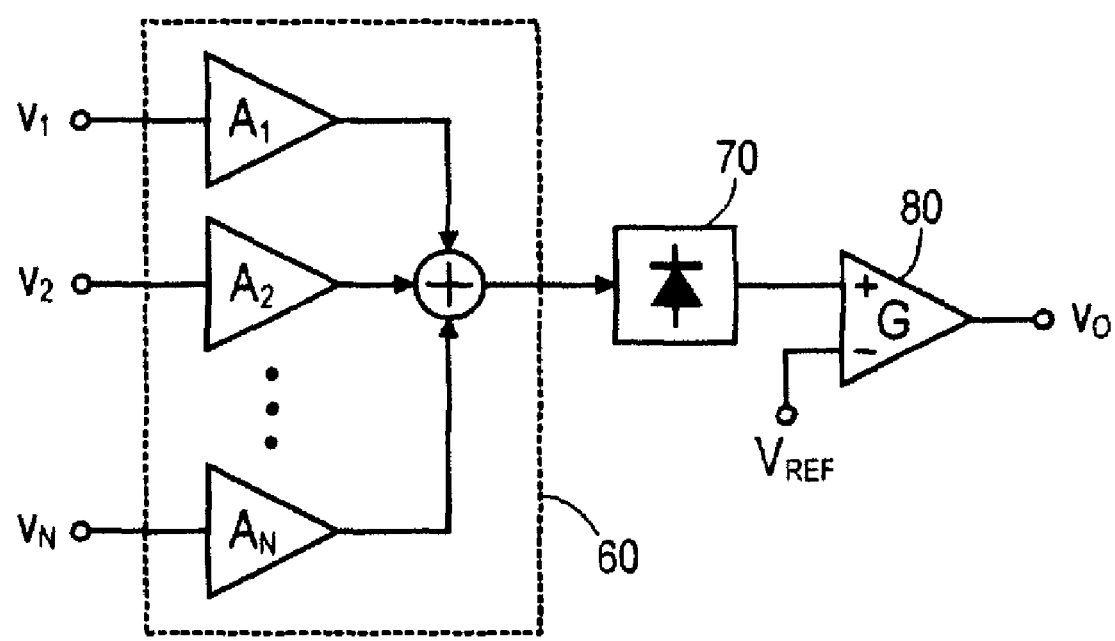

In the first place, the devices proposed enable implementation of Eq. 1 with a number of poles that is lower as compared to the known art. In fact, if the classic solution shown in FIG. 2 presents a number of significant poles equal to two (one on the peak detector and the other on the comparator for loop compensation), the solution described herein enables reduction in the number of said poles to one because the peak-hold node and the node in which the compensation is performed coincide (see FIG. 9). Reducing in the number of poles of the loop gain enables a wider closed-loop bandwidth to be obtained given the same phase margin or else, alternatively, an improved phase margin given the same bandwidth.

Observation of the circuit diagrams provided confirms, then, that the solution described herein is characterized by an extreme topological simplicity. In an integrated embodiment, the topological simplicity conveniently results in a reduced area occupation.

In addition, in the circuit diagrams proposed, the input voltage-to-current conversion is implemented via resistors. This approach enables input voltages to be handled that are even higher than the supply level (Vcc) or lower than the ground reference. Consequently, the circuits proposed are characterized by an excellent input voltage dynamics.

Figure 3A:
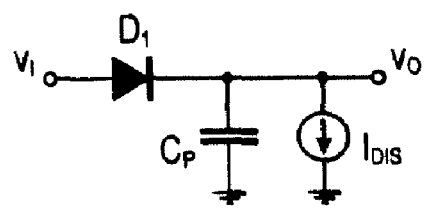
Figure 3B:
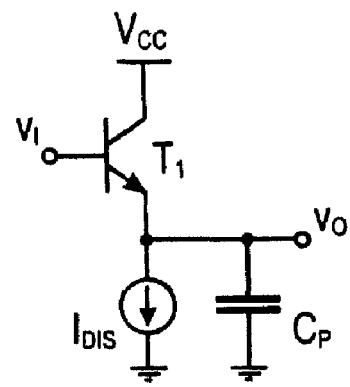
Figure 3C:
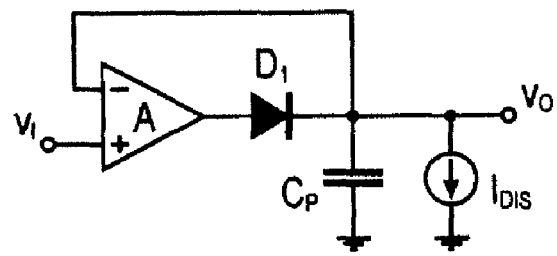

Finally, it is worthwhile noting that the solution described enables an improved accuracy in peak detection as compared to the classic open-loop solutions (see FIGS. 3A and 3B) in so far as it is not affected by the error due to the voltage drop on the rectifier device.

It should noted that, although the present invention has been described with reference to circuit diagrams using BJTs, it must be understood as being independent of the reference technology, it being possible for the aforesaid circuits to be implemented either by bipolar transistors or by field-effect transistors.

In addition, the present invention is not limited to the circuit implementations shown. Different topological modifications can, in effect, be made (such as, for example, replacement of the npn transistors with pnp transistors, and vice versa) without departing from the idea underlying the invention.

Even though the present invention has been described in relation to applications for telecommunications, it can find use in all the fields where closed-loop control is required of the peak of a periodic signal (or of a combination of periodic signals), irrespective of the nature, frequency and level of the signals involved.

Consequently, without prejudice to the principle of the invention, the details of construction and the embodiments may vary, even significantly, with respect to what is described and illustrated herein, purely by way of non-limiting example, without thereby departing from the scope of the invention, as defined in the annexed claims.

We claim:

1. A device for comparing the peak value of at least one voltage signal with a reference voltage, the device comprising:
   a reference transconductor element for converting said reference voltage into a reference current;
   at least one respective transconductor element for converting said at least one voltage signal into at least one respective current signal;
   a current-comparison node for comparing said at least one respective current signal with said reference current, generating a comparison current as a difference between said at least one respective current signal and said reference current;
   a current rectifier supplied with said comparison current; and
   a hold capacitor, charged with the output current of said current rectifier, the voltage across said capacitor indicating the outcome of the comparison between said peak value of at least one voltage signal and said reference voltage,
   wherein said current-comparison node and said current rectifier are obtained via a differential stage, supplied to the inputs of which are said voltage signal and said reference voltage, and wherein said differential stage comprises:
   a first pair of transistors biased by a first current source independent of the current signal cascaded between a supply voltage and ground and traversed by a first current, with said at least one voltage signal applied to the point of connection between the transistors of said first pair; and
   a second pair of transistors biased by a second current source independent of the current signal cascaded between a supply voltage and ground and traversed by a second current, with said reference voltage applied to the point of connection between the transistors of said second pair,
   wherein the transistors of said first pair have their control terminal short-circuited with their current-inflow terminal.

2. The device according to claim 1, wherein said reference transconductor element comprises a resistor.

3. The device according to claim 1, wherein said at least one respective transconductor element comprises a resistor.

4. The device according to claim 1, further comprising a discharge-current generator.

5. The device according to claim 1, further comprising respective resistors for supplying said at least one voltage signal and said reference voltage to the inputs of the differential stage.

6. The device according to claim 1, wherein said hold capacitor is driven via said second pair of transistors.

7. The device according to claim 1, wherein the transistor of said first pair referenced to the supply voltage and the transistor of said second pair referenced to ground have their control terminal short-circuited with their current-inflow terminal.

8. The device according to claim 1, wherein said differential stage comprises a Wilson current mirror.

9. The device according to claim 1, wherein said differential stage comprises a cascode current mirror.

10. The device according to claim 1, wherein said differential stage comprises an output cascode configuration.

11. The device according to claim 1, further comprising, downstream of said current rectifier, a stage chosen between a common-emitter stage and a common-source stage with compensation by the Miller effect in order to produce as output signal of the device a signal indicating the voltage across said capacitor.

12. The device according to claim 1, further comprising a plurality of said respective transconductor elements for converting a plurality of voltage signals into a plurality of current signals supplied to said current-comparison node.

* * * * *